(12) United States Patent
Chung

(10) Patent No.: US 11,769,565 B2
(45) Date of Patent: Sep. 26, 2023

(54) MEMORY DEVICE AND OPERATING METHOD THEREOF

(71) Applicant: SK hynix Inc., Gyeonggi-do (KR)

(72) Inventor: Seung Hyun Chung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 180 days.

(21) Appl. No.: 17/376,411

(22) Filed: Jul. 15, 2021

(65) Prior Publication Data

US 2022/0246229 A1   Aug. 4, 2022

(30) Foreign Application Priority Data

Feb. 2, 2021   (KR) ........................ 10-2021-0015000

(51) Int. Cl.
*G11C 29/36* (2006.01)
*G11C 29/14* (2006.01)
*G11C 29/12* (2006.01)
*G11C 29/46* (2006.01)

(52) U.S. Cl.
CPC ........ *G11C 29/36* (2013.01); *G11C 29/12015* (2013.01); *G11C 29/14* (2013.01); *G11C 29/46* (2013.01)

(58) Field of Classification Search
CPC ... G11C 29/36; G11C 29/12015; G11C 29/14; G11C 29/46; G11C 29/24; G11C 16/10; G11C 7/18; G11C 8/14; G11C 16/16; G11C 16/26; G11C 29/1201; G11C 2207/105; G06F 1/06; G06F 3/0656; G06F 12/0882

See application file for complete search history.

(56) References Cited

U.S. PATENT DOCUMENTS

2007/0203662 A1 * 8/2007 Sugiyama ........ G01R 31/31721
                                                                                          702/108
2017/0069396 A1 * 3/2017 Kang ..................... G11C 29/46

FOREIGN PATENT DOCUMENTS

KR       1997-0007263 B1    5/1997
KR       10-0442878 B1       8/2004

* cited by examiner

*Primary Examiner* — Mohammed A Bashar
(74) *Attorney, Agent, or Firm* — IP & T GROUP LLP

(57) ABSTRACT

A memory device which can perform various memory tests without increasing a size of the memory device. The memory device includes: a first pad for receiving external ROM data from a memory controller; a second pad for receiving an external clock signal corresponding to the external ROM data from the memory controller; and a control logic connected to the first pad and the second pad and configured to perform an operation corresponding to the external ROM data in response to the external clock signal in a test mode.

19 Claims, 16 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2021-0015000 filed on Feb. 2, 2021, the entire disclosure of which is incorporated by reference herein.

BACKGROUND

Field of Invention

The present disclosure generally relates to an electronic device, and more particularly, to a memory device and an operating method thereof.

Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Various embodiments of the present disclosure provide a memory device capable of performing various memory tests without increasing a size of the memory device, and an operating method of the memory device.

In accordance with an aspect of the present disclosure, there is provided a memory device including: a first pad configured to receive external ROM data from a memory controller; a second pad configured to receive an external clock signal corresponding to the external ROM data from the memory controller; and a control logic connected to the first pad and the second pad and configured to perform an operation corresponding to the external ROM data in response to the external clock signal in a test mode.

In accordance with another aspect of the present disclosure, there is provided a method for operating a memory device, the method including: receiving external ROM data from a memory controller through a first pad; receiving an external clock signal corresponding to the external ROM data from the memory controller through a second pad; and performing an operation corresponding to the external ROM data, based on the external clock signal, in response to a test mode.

In accordance with still another aspect of the present disclosure, there is provided a memory device including: a ROM configured to store internal ROM data; a first pad configured to receive external ROM data from a memory controller; and a control logic connected to the ROM and the first pad and configured to perform one of an operation corresponding to the internal ROM data and an operation corresponding to the external ROM data according to an operation mode.

In accordance with still another aspect of the present disclosure, there is provided an operating method of a memory device, the method including: performing, in response to a first clock, a first test operation thereon based on first test data; and performing, in response to a second clock, a second test operation thereon based on second test data, wherein the first clock is generated therefrom and the first test data is stored in a memory included therein, and wherein the second clock and the second test data are provided from an external.

BRIEF DESCRIPTION OF THE DRAWINGS

Embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
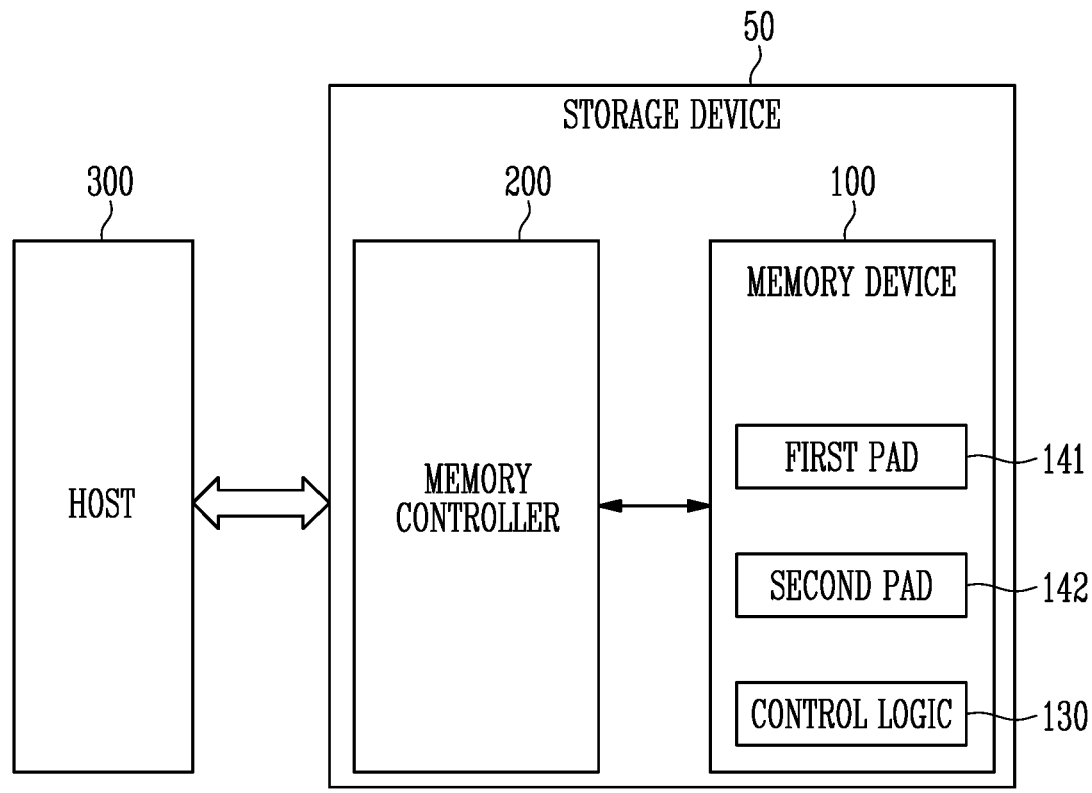
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host 300, such as a mobile phone, a smart phone, an MP3 player, a laptop computer, a desktop computer, a game console, a TV, a tablet PC or an in-vehicle infotainment system.

The storage device 50 may be manufactured as any of various types of storage devices according to a host interface that is a communication scheme with the host 300. For example, the storage device 50 may be implemented with any of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any of various types of package. For example, the storage device 50 may be manufactured as any of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may operate as any of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is described.

The memory device 100 may receive a command CMD and an address ADDR from the memory controller 200, and access a zone selected by the address ADDR in the memory cell array. The memory device 100 may perform an operation indicated by the command CMD on the zone selected by the address ADDR. For example, the memory device 100 may perform a write operation (program operation), a read operation, and an erase operation. In the program operation, the memory device 100 may program data in the zone selected by the address ADDR. In the read operation, the memory device 100 may read data from the zone selected by the address ADDR. In the erase operation, the memory device 100 may erase data stored in the zone selected by the address ADDR.

In an embodiment, the memory device 100 may be set to various operation modes such as a normal mode and a test mode. The normal mode may be a mode in which general operations such as a read operation, a program operation, and an erase operation are performed under the control of the memory controller 200. The test mode may be a mode in which test operations for checking various errors which may occur in the memory device 100 are performed. For example, the test mode may be activated after a power-on reset operation, after a reset operation of the memory device 100, according to a test operation request of the host 300, and the like.

The memory device 100 may perform operations based on various algorithms by using a ROM (not shown) and a micro controller (not shown), which are included in the memory device 100. The memory device 100 may perform various tests on the memory device 100, based on ROM data stored in the ROM. Therefore, as the number of tests on the memory device 100 increases, the size of the ROM for storing ROM data corresponding to the tests increases. Accordingly, method for performing various tests on the memory device 100 without increasing the size of the memory device 100 may be needed.

In an embodiment, the memory device 100 may include a first pad 141, a second pad 142, and a control logic 130.

In an embodiment, each of the first pad 141 and the second pad 142 may be any one of pads (or pins) for exchanging signals between the memory device 100 and the memory controller 200.

The first pad 141 may receive external ROM data from an external device (not shown). The external device may represent a device connected to the memory device 100 to transfer data, signals, or the like. For example, the first pad 141 may receive external ROM data from the memory controller 200. The external ROM data is data received from the outside of the memory device 100, and may be data including an algorithm for performing a test of the memory device 100, an algorithm for performing an internal operation such as a program operation, a read operation, or an erase operation, and the like. The memory device 100 may perform additional various tests on the memory device 100, based on the external ROM data provided from the external device.

The second pad 142 may receive an external clock signal from the external device. For example, the second pad 142 may receive an external clock signal from the memory controller 200. The external clock signal may represent a trigger signal which allows an operation corresponding to the external ROM data to be performed. For example, the operation corresponding to the external ROM data may be performed in response to the external clock signal.

The control logic 130 may be connected to the first pad 141 and the second pad 142. Also, the control logic 130 may receive the external ROM data from the external device through the first pad 141, and receive the external clock signal from the external device through the second pad 142. In an embodiment, in the test mode, the control logic 130 may perform the operation corresponding to the external ROM data in response to the external clock signal.

Accordingly, in accordance with the embodiment of the present disclosure, an operation corresponding to ROM data received from the external device is performed by using the ROM data and a clock signal, which are received from the external device, so that various memory tests can be performed without increasing a size of the memory device.

The memory controller 200 may control overall operations of the storage device 50.

When power is applied to the storage device 50, the memory controller 200 may execute instructions, e.g., firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control at least two memory devices 100. The memory controller 200 may control the memory devices according to an interleaving scheme to improve operational performance. The interleaving scheme may be a scheme for controlling operations on at least two memory devices 100 to overlap with each other.

The host 300 may communicate with the storage device 50, using at least one of various communication standards or interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
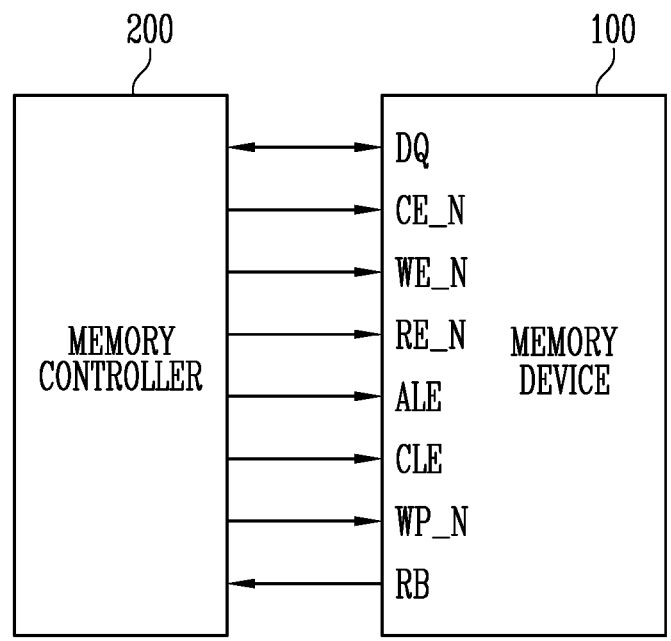
FIG. 2 is a diagram illustrating signals exchanged between a memory controller and a memory device, which are shown in FIG. 1, in accordance with an embodiment of the present disclosure.

FIG. 2 is a diagram illustrating signals exchanged between the memory controller and the memory device, which are shown in FIG. 1, in accordance with an embodiment of the present disclosure.

Referring to FIG. 2, the memory device 100 may communicate with the memory controller 200 through an input/output (DQ) line, a chip enable (CE) line, a write enable (WE_N) line, a read enable (RE_N) line, an address latch enable (ALE) line, a command latch enable (CLE) line, a write protect (WP_N) line, and a ready/busy (RB) line.

In FIG. 2, a connection relationship between one memory device 100 and the memory controller 200 is illustrated. However, in some embodiments, the present disclosure may be equally applied to a connection relationship between the memory controller 200 and a plurality of memory devices. For example, the input/output (DQ) line, the chip enable (CE) line, the write enable (WE_N) line, the read enable (RE_N) line, the address latch enable (ALE) line, the command latch enable (CLE) line, the write protect (WP_N) line, and the ready/busy (RB) line may be included in one channel, and the memory controller 200 and the plurality of memory devices may be connected to each other through the corresponding channel. Therefore, when the memory controller 200 transmits signals through lines included in one channel, all memory devices connected to the corresponding channel or a memory device selected by the memory controller 200 among the memory devices connected to the corresponding channel may receive the signals.

The input/output (DQ) line may input a command, an address, and data to the memory device 100, or output data from the memory device 100 to the memory controller 200. The input/output (DQ) line may be configured with 8 lines to transmit/receive 8-bit data, and each line may transmit/receive 1-bit data. However, the number of input/output (DQ) lines is not limited to 8, and may be extended to 16 or 32 in various embodiments.

The chip enable (CE) line may transfer a chip enable (CE) signal as a signal representing that an operation of the memory device 100 is possible. The chip enable (CE) signal may be selectively applied to memory devices connected to the same channel. When the chip enable (CE) signal falls to low, the chip enable (CE) signal may represent that all operations in a corresponding memory device 100 are possible. When the chip enable (CE) signal is high, the chip enable (CE) signal may represent that the corresponding memory device 100 is in a standby state.

The memory device 100 may receive a read enable (RE_N) signal through the read enable (RE_N) line, and receive a write enable (WE_N) signal through the write enable (WE_N) line. The read enable (RE_N) signal may be toggled when data is loaded to the memory controller 200, and the write enable (WE_N) signal may be toggled when a command and an address are loaded to the memory device 100. The command and the address may be input to a selected memory device 100, when the write enable (WE_N) signal is changed from low to high, i.e., at a rising edge of the write enable (WE_N) signal. In another embodiment, the command and the address may be input to the selected memory device 100 when the write enable (WE_N) signal is changed from high to low, i.e., at a falling edge of the write enable (WE_N) signal.

The memory device 100 may receive a command latch enable (CLE) signal through the command latch enable (CLE) line. While a command CMD is input to the memory device 100, the command latch enable (CLE) signal may become high. In addition, the memory device 100 may receive an address latch enable (ALE) signal through the address latch enable (ALE) line. While an address is input to the memory device 100, the address latch enable (ALE) signal may become high.

The memory device 100 may receive a write protect (WP_N) signal through the write protect (WP_N) line. The write protect (WP_N) signal may be a signal for inactivating program and erase operations of the memory cell array.

While an operation is performed in the memory device 100, a ready/busy (RB) signal transferred to the ready/busy (RB) line may have a low state. When the ready/busy (RB) signal is in the low state, the memory device 100 does not exchange any signal with the outside. When the ready/busy (RB) signal is high, the memory device 100 is in a ready state. When the memory device 100 is in the ready state, the memory device 100 may exchange a signal with the outside.

Figure 3:
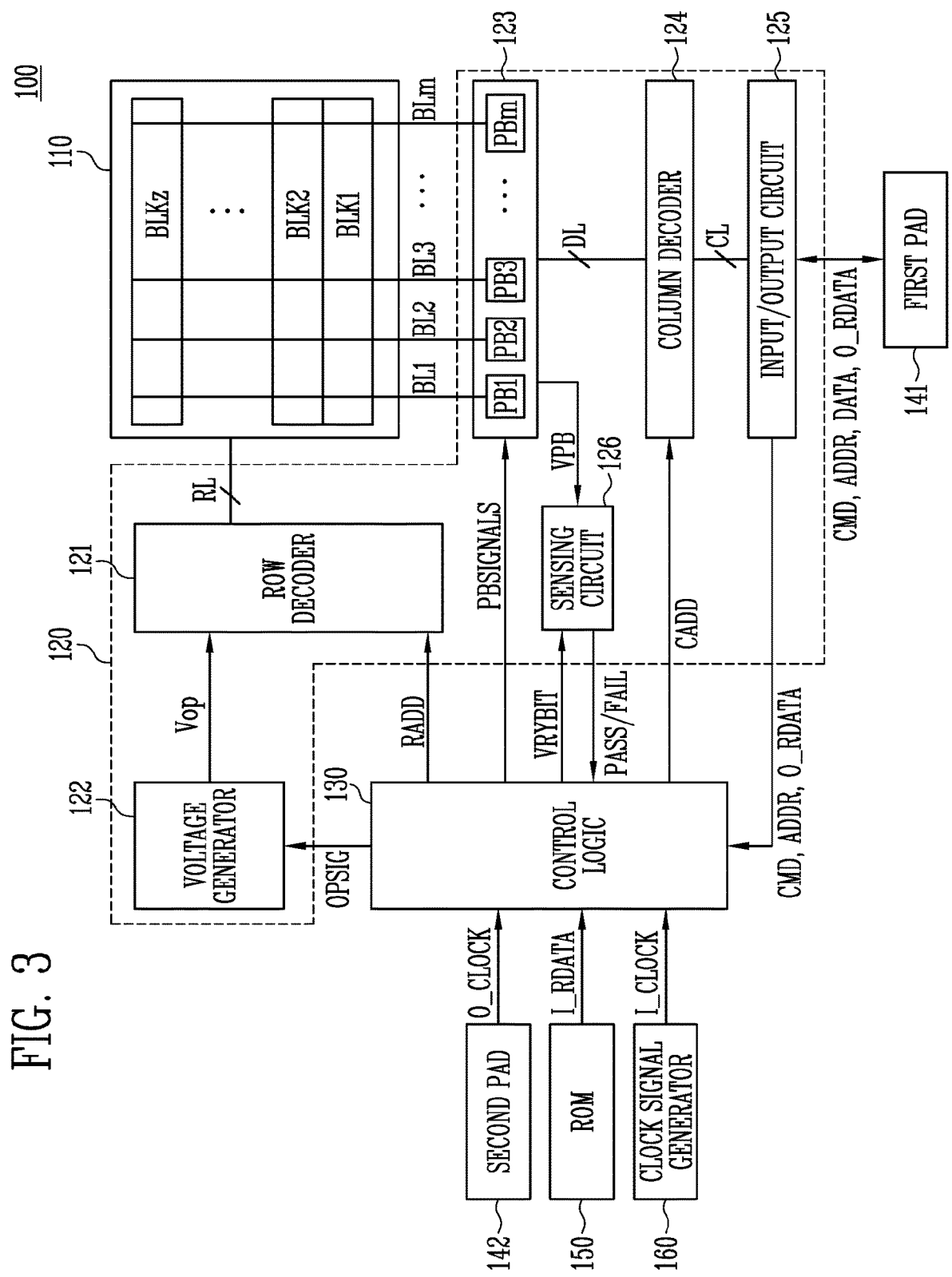
FIG. 3 is a diagram illustrating the memory device shown in FIG. 1, in accordance with an embodiment of the present disclosure.

FIG. 3 is a diagram illustrating the memory device 100 shown in FIG. 1, in accordance with an embodiment of the present disclosure.

Referring to FIG. 3, the memory device 100 may include a memory cell array 110, a peripheral circuit 120, the control logic 130, the first pad 141, the second pad 142, a ROM 150, and a clock signal generator 160.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLm, or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 operates under the control of the control logic. The row decoder 121 receives a row address RADD from the control logic 130.

The row decoder 121 decodes the row address RADD. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level different from (e.g., lower than) that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a reference voltage (e.g., ground voltage) to word lines connected to the selected memory blocks.

The voltage generator 122 operates under the control of the control logic 130. The voltage generator 122 generates a plurality of voltages by using an external power voltage supplied to the memory device 100. Specifically, the voltage generator may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to mth page buffers PB1 to PBm. The first to mth page buffers PB1 to PBm are connected to the memory cell array 110 respectively through first to mth bit lines BL1 to BLm. The first to mth page buffers PB1 to PBm operate under the control of the control logic 130. Specifically, the first to mth page buffers PB1 to PBm may operate in response to page buffer control signals PBSIGNALS. For example, the first to mth page buffers PB1 to PBm may temporarily store data received through the first to mth bit lines BL1 to BLm, or sense a voltage or current of the bit lines BL1 to BLm in a read or verify operation.

Specifically, in a program operation, the first to mth page buffers PB1 to PBm may transfer data DATA received through the input/output circuit 125 to selected memory cells through the first to mth bit lines BL1 to BLm, when a program voltage is applied to a selected word line. Memory cells of a selected page are programmed according to the transferred data DATA. A memory cell connected to a bit line to which a program allow voltage (e.g., a ground voltage) is applied may have an increased threshold voltage. A threshold voltage of a memory cell connected to a bit line to which a program inhibit voltage (e.g., a power voltage) is applied may be maintained. In a program verify operation, the first to mth page buffers PB1 to PBm read page data from the selected memory cells through the first to mth bit lines BL1 to BLm.

In a read operation, the first to mth page buffers PB1 to PBm read data DATA from the memory cells of the selected page through the first to mth bit lines BL1 to BLm, and output the read data DATA to the input/output circuit 125 under the control of the column decoder 124.

In an erase operation, the first to mth page buffers PB1 to PBm may float the first to mth bit lines BL1 to BLm.

The column decoder 124 may communicate data between the input/output circuit 125 and the page buffer group 123 in response to a column address CADD. For example the column decoder 124 may communicate data with the first to mth page buffers PB1 to PBm through data lines DL, or communicate data with the input/output circuit 125 through column lines CL.

The input/output circuit 125 may transfer a command CMD and an address ADDR, which are received from the memory controller 200 described with reference to FIG. 1, to the control logic 130, or exchange data DATA with the column decoder 124.

In an embodiment, the input/output circuit 125 may receive a command CMD, an address ADDR, and data DATA, which are input from the memory controller 200, through the input/output (DQ) line shown in FIG. 2, or output data DATA to the memory controller 200.

In an embodiment, the input/output circuit 125 may be connected to the first pad 141. In FIG. 3, a case where the first pad 141 is directly connected to the input/output circuit 125 is illustrated. However, in some embodiments, the first pad 141 may be directly connected to the control logic 130.

In a read operation or verify operation, the sensing circuit 125 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass or fail signal PASS or FAIL.

In an embodiment, the control logic 130 may receive the chip enable (CE) signal, the write enable (WE_N) signal, the read enable (RE_N) signal, the address latch enable (ALE) signal, the command latch enable (CLE) signal, the write protect (WP_N) signal, and the ready/busy signal RB through the input/output (DQ) line, the chip enable (CE) line, the write enable (WE_N) line, the read enable (RE_N) line, the address latch enable (ALE) line, the command latch enable (CLE) line, the write protect (WP_N) line, and the ready/busy (RB) line, which are shown in FIG. 2.

In an embodiment, the control logic 130 may be connected to the first pad 141, the second pad 142, the ROM 150, and the clock signal generator 160.

In an embodiment, the control logic 130 may receive external ROM data O_RDATA from the first pad 141. For example, the control logic 130 may receive the external ROM data O_RDATA from the first pad 141 through the input/output circuit 125. The control logic 130 may receive an external clock signal O_CLOCK from the second pad 142.

The ROM 150 may store internal ROM data I_RDATA. The internal ROM data I_RDATA is data pre-stored in the memory device 100, and may be data including an algorithm for performing a test of the memory device 100, or an algorithm for performing an internal operation such as a program operation, a read operation, or an erase operation, and the like. In an embodiment, the control logic 130 may receive the internal ROM data I_RDATA from the ROM 150.

The clock signal generator 160 may generate an internal clock signal I_CLOCK corresponding to the internal ROM data I_RDATA. The internal clock signal I_CLOCK may represent a trigger signal which allows an operation corresponding to the internal ROM data I_RDATA to be performed. For example, an operation corresponding to the internal ROM data I_RDATA may be performed in response to the internal clock signal I_CLOCK. In an embodiment, the control logic 130 may receive the internal clock signal I_CLOCK from the clock signal generator 160.

Figure 4:
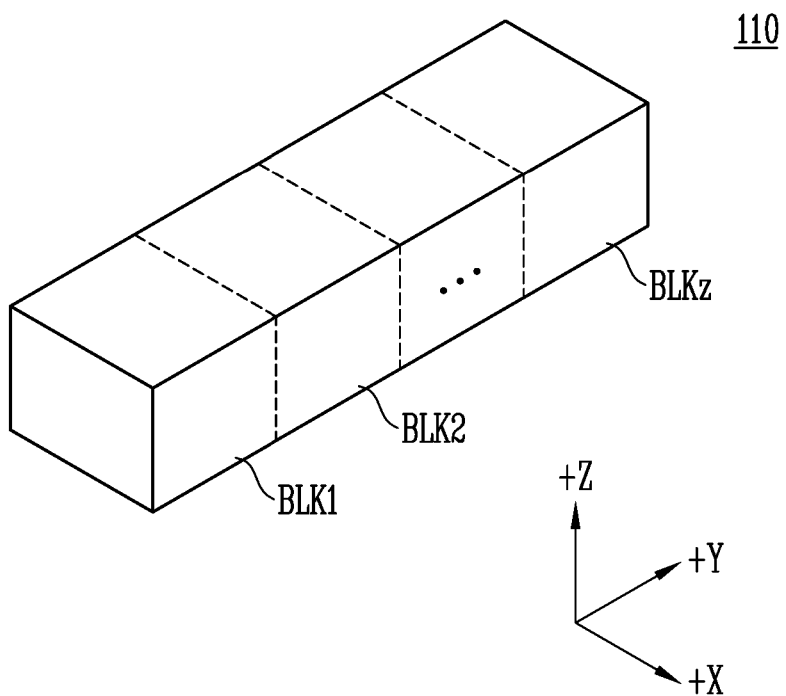
FIG. 4 is a diagram illustrating an embodiment of a memory cell array shown in FIG. 3, in accordance with an embodiment of the present disclosure.

FIG. 4 is a diagram illustrating an embodiment of a memory cell array shown in FIG. 3, in accordance with an embodiment of the present disclosure.

Referring to FIG. 4, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 5 and 6.

Figure 5:
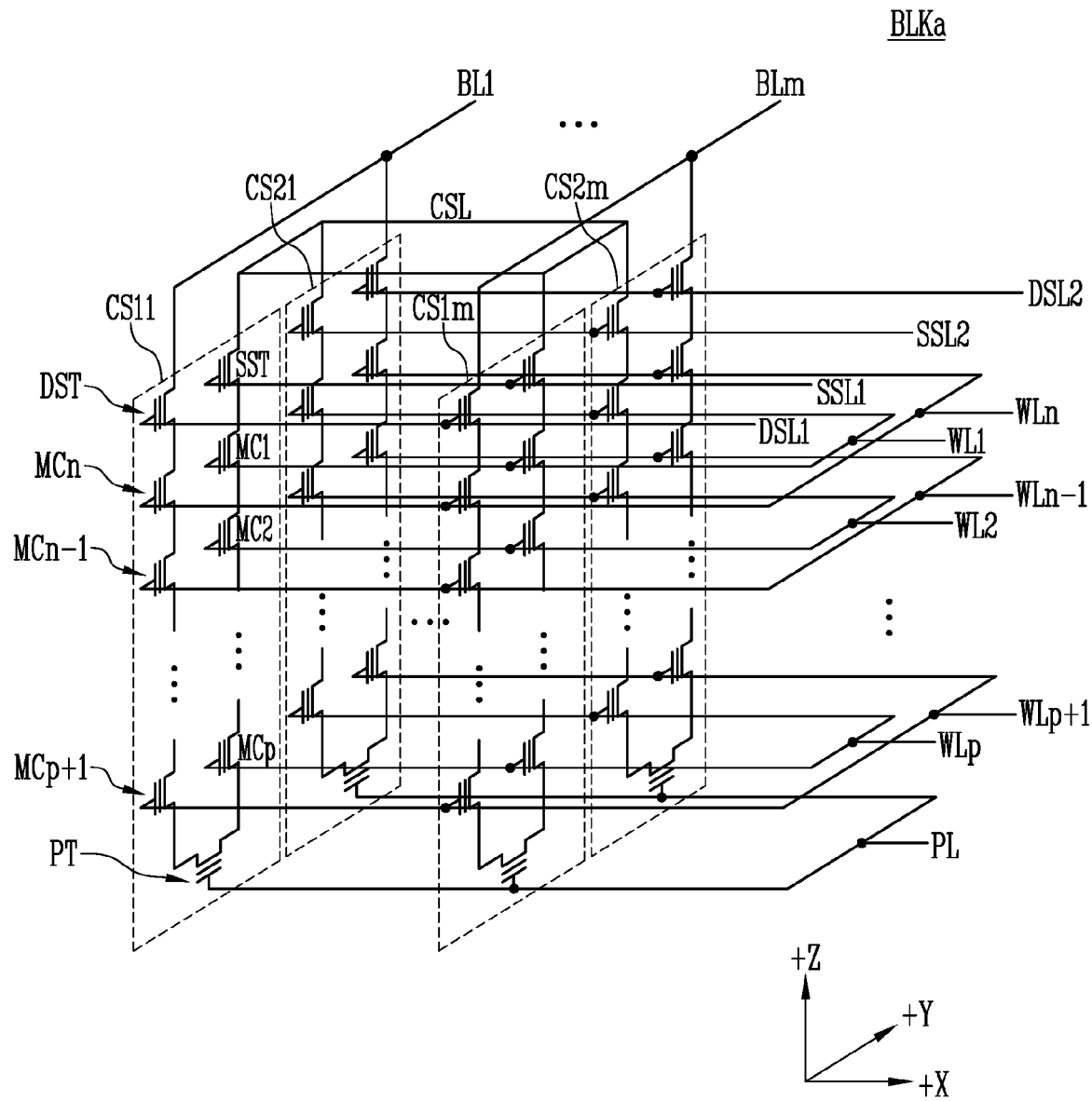
FIG. 5 is a circuit diagram illustrating a memory block among memory blocks shown in FIG. 4, in accordance with an embodiment of the present disclosure.

FIG. 5 is a circuit diagram illustrating any one memory block BLKa among the memory blocks BLK1 to BLKz shown in FIG. 4, in accordance with an embodiment of the present disclosure.

Referring to FIG. 5, the memory block BLKa may include a plurality of memory cell strings CS11 to CS1$m$ and CS21 to CS2$m$. In an embodiment, each of the plurality of memory cell strings CS11 to CS1$m$ and CS21 to CS2$m$ may be formed in a 'U' shape. In the memory block BLKa, m memory cell strings are arranged in a row direction (i.e., a +X direction). FIG. 5 illustrates two memory cell strings arranged in a column direction (i.e., a +Y direction). However, this is for convenience of description, and it will be understood that three or more memory cell strings may be arranged in the column direction.

Each of the plurality of memory cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each memory cell string. In an embodiment, a pillar for providing at least one of the channel layer, the tunneling insulating layer, the charge storage layer, and the blocking insulating layer may be provided in each memory cell string.

The source select transistor SST of each memory cell string is connected between a common source line CSL and memory cells MC1 to MCp.

In an embodiment, the source select transistors of memory cell strings arranged on the same row are connected to a source select line extending in the row direction, and the source select transistors of memory cell strings arranged on different rows are connected to different source select lines. In FIG. 5, the source select transistors of the memory cell strings CS11 to CS1$m$ on a first row are connected to a first source select line SSL1. The source select transistors of the memory cell strings CS21 to CS2$m$ on a second row are connected to a second source select line SSL2.

In another embodiment, the source select transistors of the memory cell strings CS11 to CS1$m$ and CS21 to CS2$m$ may be commonly connected to one source select line.

The first to nth memory cells MC1 to MCn of each memory cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each memory cell string are connected to first to nth word lines WL1 to WLn, respectively.

A gate of the pipe transistor PT of each memory cell string is connected to a pipe line PL.

The drain select transistor DST of each memory cell string is connected between a corresponding bit line and the memory cells MCp+1 to MCn. Memory cell strings arranged in the row direction are connected to a drain select line extending in the row direction. The drain select transistors of the memory cell strings CS11 to CS1$m$ on the first row are connected to a first drain select line DSL1. The drain select transistors of the memory cell strings CS21 to CS2$m$ on the second row are connected to a second drain select line DSL2.

Memory cell strings arranged in the column direction are connected to a bit line extending in the column direction. In FIG. 5, the memory cell strings CS11 and CS21 on a first column are connected to a first bit line BL1. The memory cell strings CS1$m$ and CS2$m$ on an mth column are connected to an mth bit line BLm.

Memory cells connected to the same word line in the memory cell strings arranged in the row direction constitute one page. For example, memory cells connected to the first word line WL1 in the memory cell strings CS11 to CS1$m$ on the first row constitute one page. Memory cells connected to the first word line WL1 in the memory cell strings CS21 to CS2$m$ on the second row constitute another page. When any of the drain select lines DSL1 and DSL2 is selected, memory cell strings arranged in one row direction may be selected. When any of the word lines WL1 to WLn is selected, one page may be selected in the selected memory cell strings.

In another embodiment, even bit lines and odd bit lines may be provided instead of the first to mth bit lines BL1 to BLm. In addition, even-numbered memory cell strings among the memory cell strings CS11 to CS1$m$ or CS21 to CS2$m$ arranged in the row direction may be connected to the even bit lines, respectively, and odd-numbered memory cell strings among the memory cell strings CS11 to CS1$m$ or CS21 to CS2$m$ arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 6:
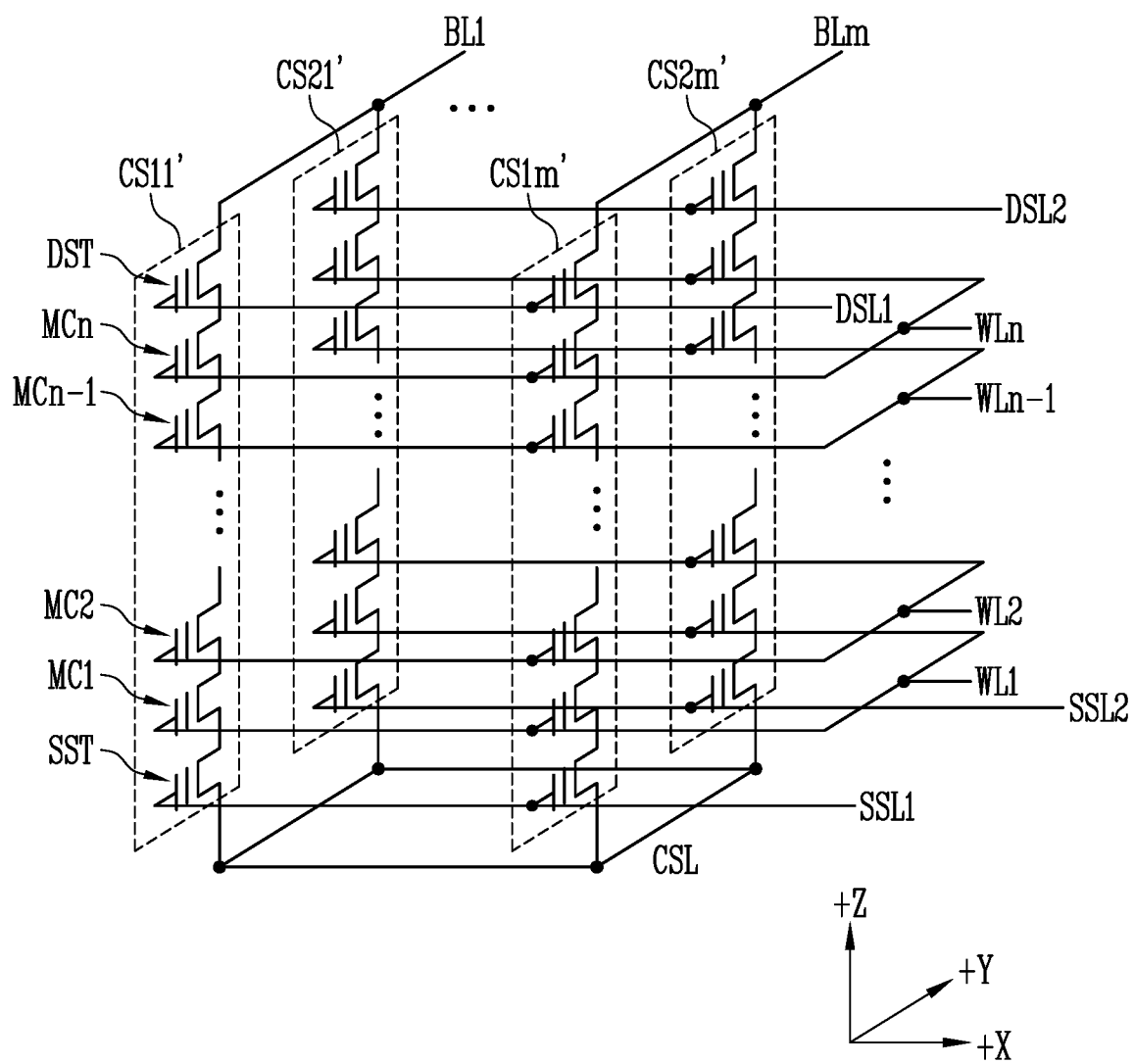
FIG. 6 is a circuit diagram illustrating another embodiment of the memory block among the memory blocks shown in FIG. 4, in accordance with an embodiment of the present disclosure.

FIG. 6 is a circuit diagram illustrating another embodiment BLKb of the memory block among the memory blocks BLK1 to BLKz shown in FIG. 4, in accordance with an embodiment of the present disclosure.

Referring to FIG. 6, the memory block BLKb may include a plurality of memory cell strings CS11' to CS1$m$' and CS21' to CS2$m$'. Each of the plurality of memory cell strings CS11' to CS1$m$' and CS21' to CS2$m$' extends along the +Z direction. Each of the plurality of memory cell strings CS11' to CS1$m$' and CS21' to CS2$m$' includes at least one source select transistor SST, first to nth memory cells MC1 to MCn, and at least one drain select transistor DST, which are stacked on a substrate (not shown) under the memory block BLKb.

The source select transistor SST of each memory cell string is connected between a common source line CSL and the memory cells MC1 to MCn. The source select transistors of memory cell strings arranged on the same row are connected to the same source select line. The source select transistors of the memory cell strings CS11' to CS1$m$' arranged on a first row are connected to a first source select line SSL1. Source select transistors of the memory cell strings CS21' to CS2$m$' arranged on a second row are connected to a second source select line SSL2. In another embodiment, the source select transistors of the memory cell strings CS11' to CS1$m$' and CS21' to CS2$m$' may be commonly connected to one source select line.

The first to nth memory cells MC1 to MCn of each memory cell string are connected in series between the source select transistor SST and the drain select transistor DST. Gate electrodes of the first to nth memory cells MC1 to MCn are connected to first to nth word lines WL1 to WLn, respectively.

The drain select transistor DST of each memory cell string is connected between a corresponding bit line and the memory cells MC1 to MCn. The drain select transistors of memory cell strings arranged in the row direction are connected to a drain select line extending in the row direction. The drain select transistors of the memory cell strings CS11' to CS1$m$' on the first row are connected to a first drain select line DSL1. The drain select transistors of the memory cell strings CS21' to CS2$m$' on the second row are connected to a second drain select line DSL2.

Consequently, the memory block BLKb of FIG. 6 has a circuit similar to that of the memory block BLKa of FIG. 5, except that the pipe transistor PT is excluded from each memory cell string in FIG. 6.

In another embodiment, even bit lines and odd bit lines may be provided instead of the first to mth bit lines BL1 to BLm. In addition, even-numbered memory cell strings among the memory cell strings CS11' to CS1$m$' or CS21' to CS2$m$' arranged in the row direction may be connected to the even bit lines, respectively, and odd-numbered memory cell strings among the memory cell strings CS11' to CS1$m$' or CS21' to CS2$m$' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 7:
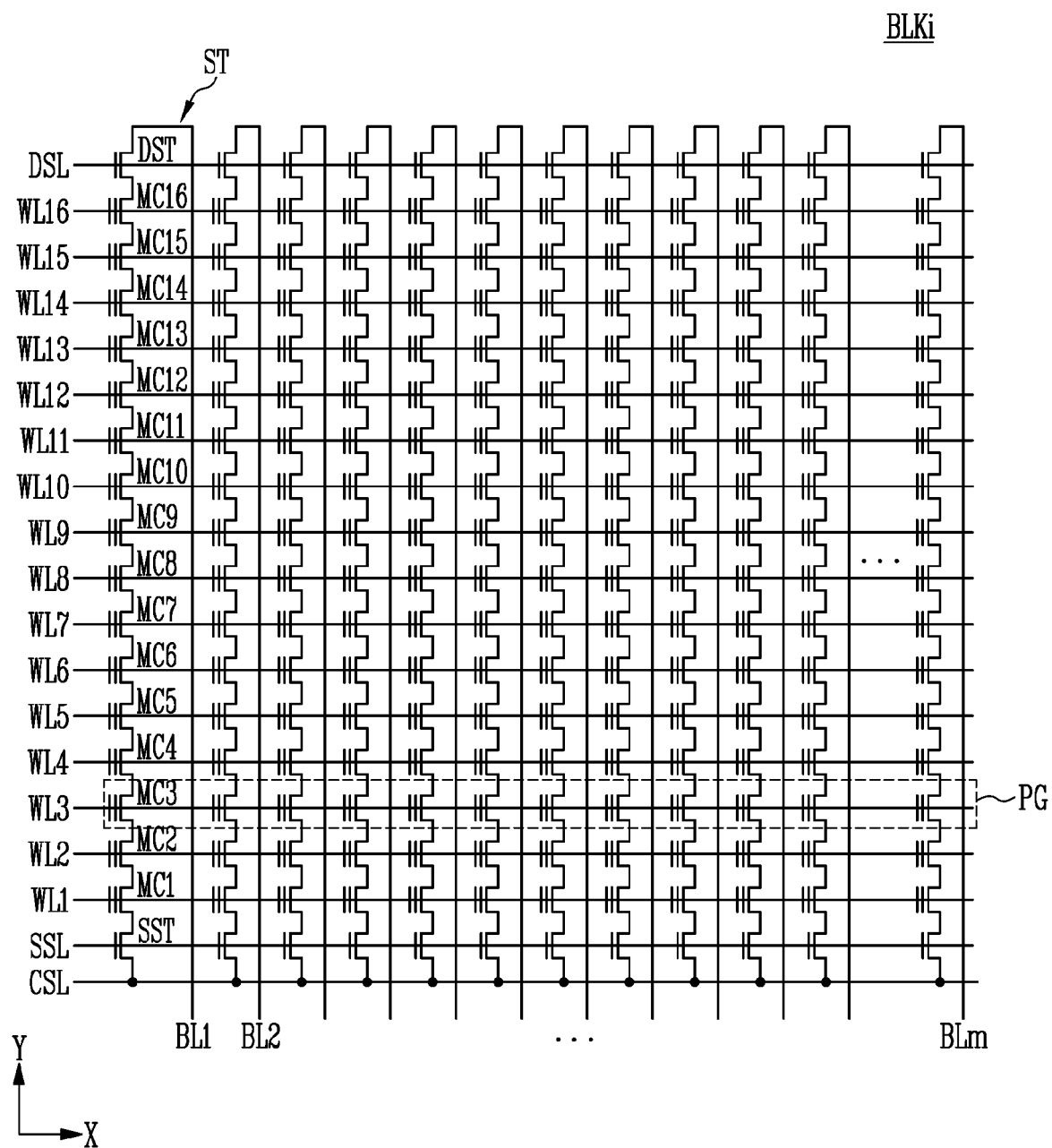
FIG. 7 is a circuit diagram illustrating still another embodiment of the memory block among the memory blocks shown in FIG. 4, in accordance with an embodiment of the present disclosure.

FIG. 7 is a circuit diagram illustrating still another embodiment BLKi of the memory block among the memory blocks BLK1 to BLKz shown in FIG. 4, in accordance with an embodiment of the present disclosure.

Referring to FIG. 7, in the memory block BLKi, a plurality of word lines arranged in parallel to each other may be connected between a first select line and a second select line. The first select line may be a source select line SSL, and the second select line may be a drain select line DSL. More specifically, the memory block BLKi may include a plurality of memory cell strings ST connected between bit lines BL1 to BLm and a common source line CSL. The bit lines BL1 to BLm may be respectively connected to the memory cell strings ST, and the common source line CSL may be commonly connected to the memory cell strings ST. The memory cell strings ST may be configured identically to one another, and therefore, a memory cell string ST connected to a first bit line BL1 will be described in detail as an example.

The memory cell string ST may include a source select transistor SST, a plurality of memory cells MC1 to MC16, and a drain select transistor DST, which are connected in series to each other between the common source line CSL and the first bit line BL1. At least one drain select transistor DST may be included in one memory cell string ST, and a number of source select transistors which is greater than that of the source select transistor SST shown in the drawing and a number of memory cells which is greater than that of the memory cells MC1 to MC16 shown in the drawing may be included in the one memory cell string ST.

A source of the source select transistor SST may be connected to the common source line SL, and a drain of the drain select transistor DST may be connected to the first bit line BL1. The memory cells MC1 to MC16 may be connected in series between the source select transistor SST and the drain select transistor DST. Gates of source select transistors SST included in different memory cell strings ST may be connected to the source select line SSL, and gates of drain select transistors DST included in different memory cell strings ST may be connected to the drain select line DSL. Gates of the memory cells MC1 to MC16 may be connected to a plurality of word lines WL1 to WL16. A group of memory cells connected to the same word line among memory cells included in different memory cell strings ST may be referred to as a physical page PG. Therefore, physical pages PG corresponding to the number of the word lines WL1 to WL16 may be included in the memory block BLKi.

One memory cell may store one-bit data. The one memory cell is generally referred to as a single level cell (SLC). One physical page PG may store one logical page (LPG) data. One LPG data may include data bits corresponding to the number of cells included in the one physical page PG.

One memory cell may store two or more-bit data. One physical page PG may store two or more LPG data.

Figure 8:
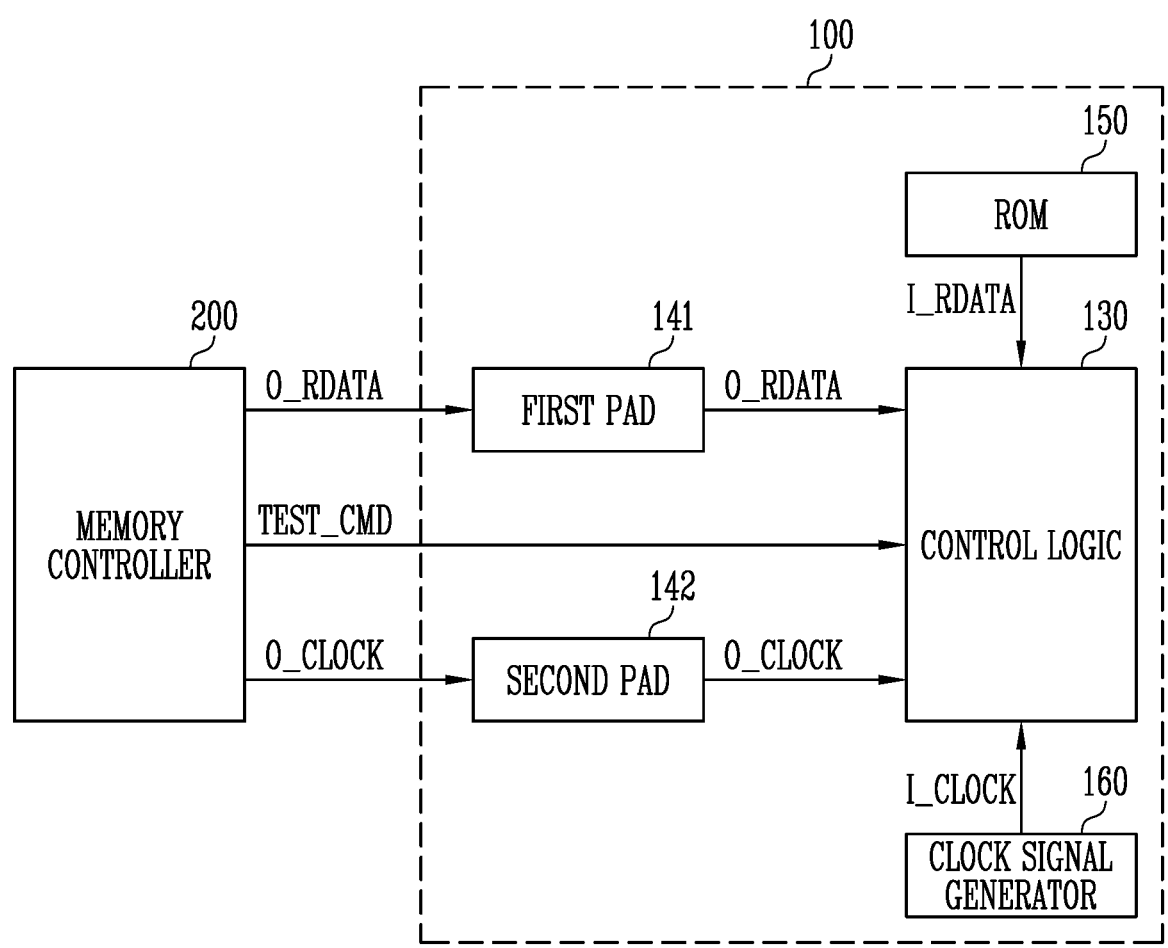
FIG. 8 is a diagram illustrating a memory device in accordance with an embodiment of the present disclosure.

FIG. 8 is a diagram illustrating a memory device 100 in accordance with an embodiment of the present disclosure.

The memory device 100 shown in FIG. 8 may represent the memory device 100 shown in FIG. 2. In addition, a first pad 141, a second pad 142, a ROM 150, and a clock signal generator 160, which are shown in FIG. 8, may respectively represent the first pad 141, the second pad 142, the ROM 150, and the clock signal generator 160, which are shown in FIG. 3.

Referring to FIG. 8, the memory device 100 may include a control logic 130, the first pad 141, the second pad 142, the ROM 150, and the clock signal generator 160.

In an embodiment, the control logic 130 may receive a test command TEST_CMD from the memory controller 200. The test command TEST_CMD may be a command for activating an operation mode of the memory device 100 as a test mode. The control logic 130 may set the operation mode of the memory device 100 as the test mode in response to the test command TEST_CMD.

In an embodiment, the control logic 130 may receive external ROM data O_RDATA from the first pad 141. Also, the control logic 130 may receive an external clock signal O_CLOCK from the second pad 142.

The first pad 141 may receive the external ROM data O_RDATA from the memory controller 200. The first pad 141 may transmit the external ROM data O_RDATA to the control logic 130.

The second pad 142 may receive the external clock signal O_CLOCK corresponding to the external ROM data O_RDATA from the memory controller 200. The second pad 142 may transmit the external clock signal O_CLOCK to the control logic 130.

In an embodiment, each of the first pad 141 and the second pad 142 may be connected to any of the input/output (DQ) line, the chip enable (CE) line, the write enable (WE_N) line, the read enable (RE_N) line, the address latch enable (ALE) line, the command latch enable (CLE) line, the write protect (WP_N) line, and the ready/busy (RB) line, which are shown in FIG. 2. For example, the first pad 141 may be a pad connected to the input/output (DQ) line. That is, the first pad 141 may be an input/output (DQ) pad which receives data input from the memory controller 200 or outputs data to the memory controller 200. For example, the second pad 142 may be a pad connected to the read enable (RE_N) line. That is, the second pad 142 may be a read enable (RE_N) pad which receives the read enable (RE_N) signal from the memory controller 200.

In an embodiment, the control logic 130 may receive internal ROM data I_RDATA from the ROM 150. Also, the control logic 130 may receive an internal clock signal I_CLOCK from the clock signal generator 160.

In an embodiment, the control logic 130 may perform one of an operation corresponding to the internal ROM data I_RDATA and an operation corresponding to the external ROM data O_RDATA according to the operation mode of the memory device 100. For example, in the normal mode, the control logic 130 may perform the operation corresponding to the internal ROM data I_RDATA in response to the internal clock signal I_CLOCK. In another example, in the test mode, the control logic 130 may perform the operation corresponding to the external ROM data O_RDATA in response to the external clock signal O_CLOCK.

Figure 9:
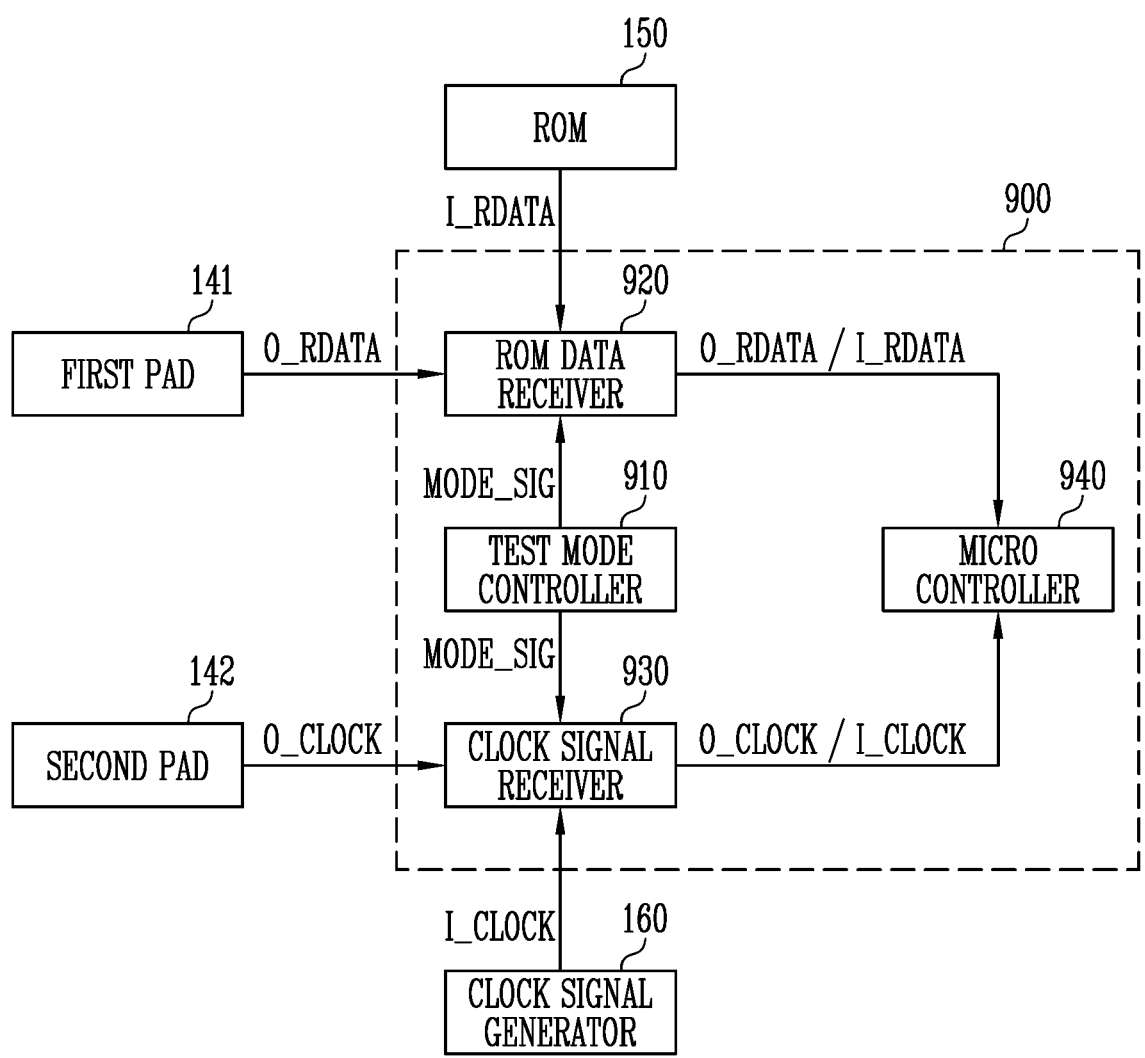
FIG. 9 is a diagram illustrating a control logic in accordance with an embodiment of the present disclosure.

FIG. 9 is a diagram illustrating a control logic in accordance with an embodiment of the present disclosure.

The control logic 900 shown in FIG. 9 may represent the control logic 130 shown in FIG. 3 or FIG. 8. In addition, a first pad 141, a second pad 142, a ROM 150, and a clock signal generator 160, which are shown in FIG. 9, may respectively represent the first pad 141, the second pad 142, the ROM 150, and the clock signal generator 160, which are shown in FIG. 3 or FIG. 8.

Referring to FIG. 9, the control logic 900 may include a test mode controller 910, a ROM data receiver 920, a clock signal receiver 930, and a micro controller 940.

The test mode controller 910 may generate a test mode control signal MODE_SIG for activating the test mode. In an embodiment, the test mode may be activated according to various situations such as after a power-on reset operation, after a reset operation of the memory device 100, and a test operation request of the host 300. For example, the test mode controller 910 may receive a test command from the memory controller 200. The test mode controller 910 may generate the test mode control signal MODE_SIG and transfer the test mode control signal MODE_SIG to the ROM data receiver 920 and the clock signal receiver 930. The ROM data receiver 920 and the clock signal receiver 930 may perform operations corresponding to the test mode in response to the test mode control signal MODE_SIG.

The ROM data receiver 920 may receive one of internal ROM data I_RDATA and external ROM data O_RDATA according to the operation mode of the memory device 100.

In an embodiment, in the normal mode, the ROM data receiver 920 may receive internal ROM data I_RDATA from the ROM 150. The ROM data receiver 920 may transfer the internal ROM data I_RDATA to the micro controller 940.

Also, in an embodiment, in the test mode, the ROM data receiver 920 may receive external ROM data O_RDATA from the memory controller 200 through the first pad 141. For example, the ROM data receiver 920 may receive the external ROM data O_RDATA through the first pad 141 in response to the test mode control signal MODE_SIG. The ROM data receiver 920 may transfer the external ROM data O_RDATA to the micro controller 940.

The clock signal receiver 930 may receive one of internal clock signal I_CLOCK and external clock signal O_CLOCK according to the operation mode of the memory device 100.

In an embodiment, in the normal mode, the clock signal receiver 930 may receive an internal clock signal I_CLOCK from the clock signal generator 160. The clock signal receiver 930 may transfer the internal clock signal I_CLOCK to the micro controller 940.

Also, in an embodiment, in the test mode, the clock signal receiver 930 may receive an external clock signal O_CLOCK from the memory controller 200 through the second pad 142. For example, the clock signal receiver 930 may receive the external clock signal O_CLOCK through the second pad 142 in response to the test mode control signal MODE_SIG. The clock receiver 930 may transfer the external clock signal O_CLOCK to the micro controller 940.

The micro controller 940 may perform an operation corresponding to the internal ROM data I_RDATA in response to the internal clock signal I_CLOCK or perform an operation corresponding to the external ROM data O_RDATA in response to the external clock signal O_CLOCK, according to the operation mode of the memory device 100.

In an embodiment, in the normal mode, the micro controller 940 may perform the operation corresponding to the internal ROM data I_RDATA in response to the internal clock signal I_CLOCK.

Also, in an embodiment, in the test mode, the micro controller 940 may perform the operation corresponding to the external ROM data O_RDATA in response to the external clock signal O_CLOCK.

Accordingly, in accordance with the embodiment of the present disclosure, an operation corresponding to ROM data is performed by using the ROM data and a clock signal, which are received from the external device, so that various memory tests can be performed without increasing a size of the memory device.

Figure 10:
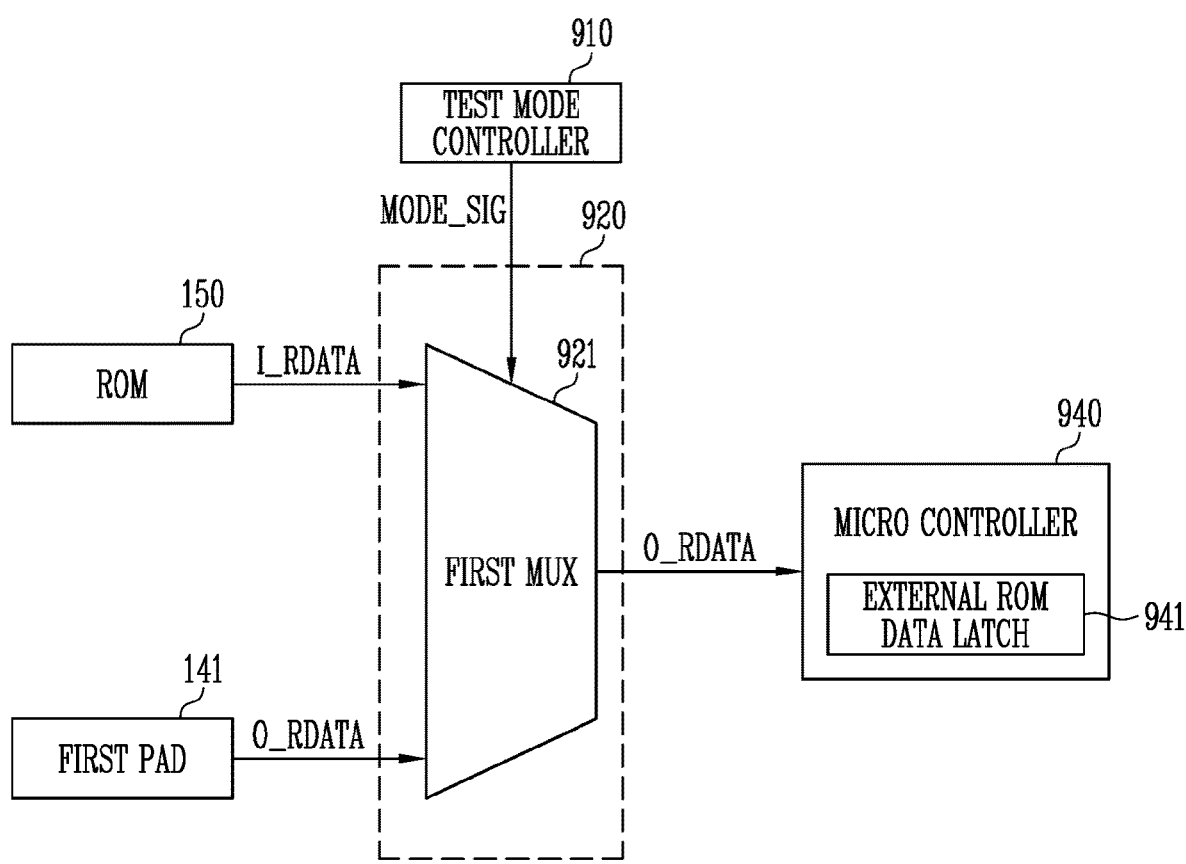
FIG. 10 is a diagram illustrating a ROM data receiver in accordance with an embodiment of the present disclosure.

FIG. 10 is a diagram illustrating a ROM data receiver 920 in accordance with an embodiment of the present disclosure.

The ROM data receiver 920 shown in FIG. 10 may represent the ROM data receiver 920 shown in FIG. 9. In addition, a first pad 141, a ROM 150, a test mode controller 910, and a micro controller 940, which are shown in FIG. 10, may respectively represent the first pad 141, the ROM 150, the test mode controller 910, and the micro controller 940, which are shown in FIG. 9.

Referring to FIG. 10, the ROM data receiver 920 may include a first MUX 921.

In an embodiment, the first MUX 921 may receive internal ROM data I_RDATA from the ROM 150 or receive external ROM data O_RDATA from the first pad 141. The first MUX 921 may output one of the internal ROM data I_RDATA and the external ROM data O_RDATA according to the operation mode.

For example, the first MUX 921 may receive a test mode control signal MODE_SIG from the test mode controller 910. The first MUX 921 may operate according to the test mode. Accordingly, the first MUX 921 may output the external ROM data O_RDATA to the micro controller 940 in response to the test mode control signal MODE_SIG.

In an embodiment, the micro controller 940 may include an external ROM data latch 941 which stores the external ROM data O_RDATA. The external ROM data latch 941 may store the external ROM data O_RDATA received from the first pad 141 through the ROM data receiver 920.

Figure 11:
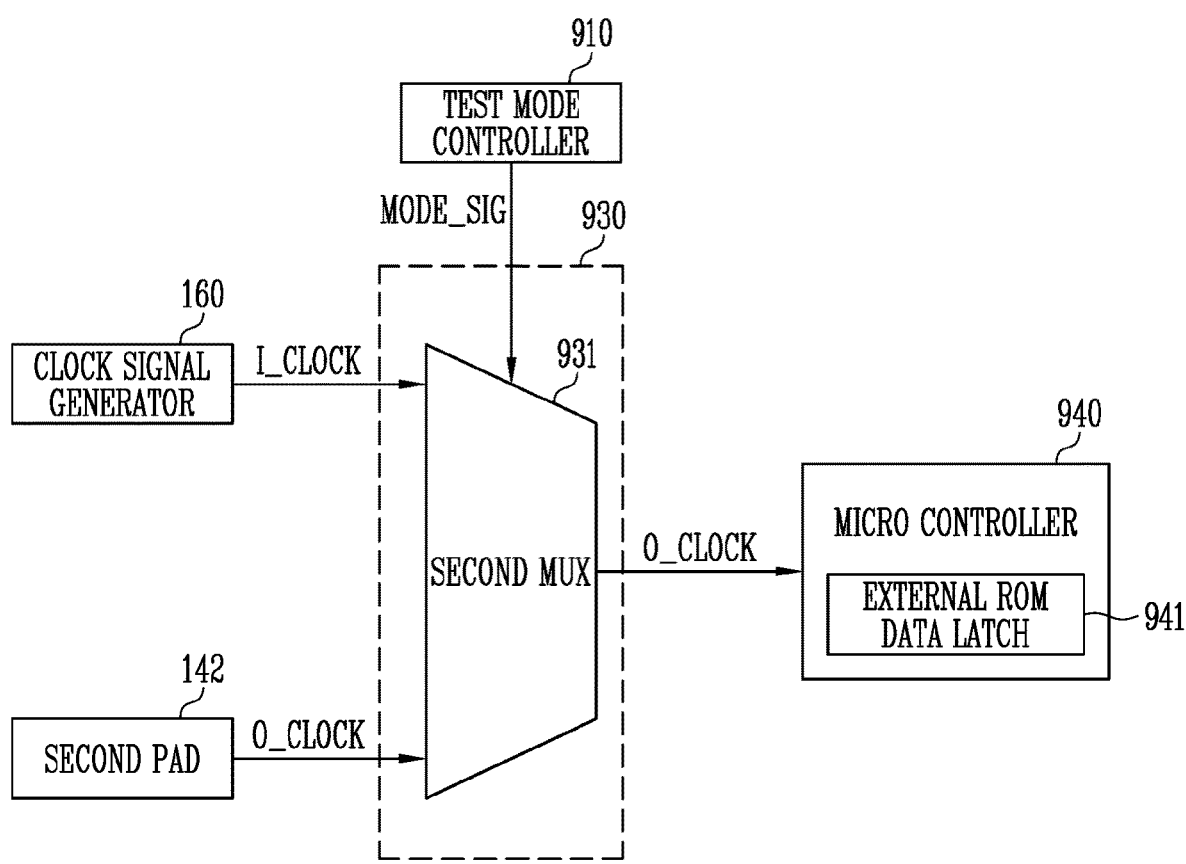
FIG. 11 is a diagram illustrating a clock signal receiver in accordance with an embodiment of the present disclosure.

FIG. 11 is a diagram illustrating a clock signal receiver 930 in accordance with an embodiment of the present disclosure.

The clock signal receiver 930 shown in FIG. 11 may represent the clock signal receiver 930 shown in FIG. 9. In addition, a second pad 142, a clock signal generator 160, a test mode controller 910, and a micro controller 940, which are shown in FIG. 11, may respectively represent the second pad 142, the clock signal generator 160, the test mode controller 910, and the micro controller 940, which are shown in FIG. 9.

Referring to FIG. 11, the clock signal receiver 930 may include a second MUX 931.

In an embodiment, the second MUX 931 may receive an internal clock signal I_CLOCK from the clock signal generator 160 or receive an external clock signal O_CLOCK from the second pad 142. The second MUX 931 may output one of the internal clock signal I_CLOCK and the external clock signal O_CLOCK according to the operation mode.

For example, the second MUX 931 may receive a test mode control signal MODE_SIG from the test mode controller 910. The second MUX 931 may operate according to the test mode. Accordingly, the second MUX 931 may output the external clock signal O_CLOCK to the micro controller 940 in response to the test mode control signal MODE_SIG.

In an embodiment, the micro controller 940 may perform an operation corresponding to the external ROM data O_RDATA stored in the external ROM data latch 941 in response to the external clock signal O_CLOCK.

Figure 12:
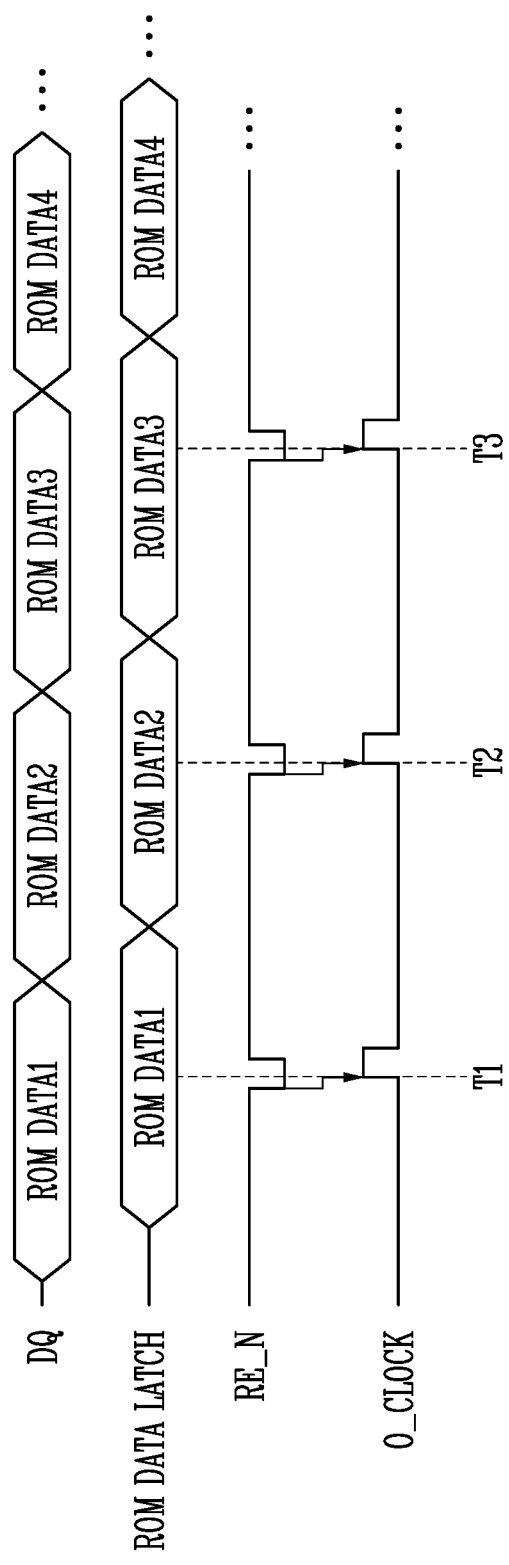
FIG. 12 is a timing diagram illustrating an operation corresponding to external ROM data in accordance with an embodiment of the present disclosure.

FIG. 12 is a timing diagram illustrating an operation corresponding to external ROM data in accordance with an embodiment of the present disclosure.

In FIG. 12, the first pad 141 is an input/output (DQ) pad which receives a signal of the input/output (DQ) line, and the second pad 142 is a read enable (RE_N) pad which receives a read enable (RE_N) signal.

Referring to FIG. 12, the signal of the input/output (DQ) line, a signal ROM DATA LATCH of the external ROM data latch 941, the read enable (RE_N) signal, and an external clock signal O_CLOCK are illustrated.

The memory device 100 may receive external ROM data ROM DATA1 to ROM DATA4 from the outside through the input/output (DQ) line. In addition, the external ROM data ROM DATA1 to ROM DATA4 may be stored in the external ROM data latch 941.

Subsequently, the memory device 100 may receive the external clock signal O_CLOCK in a state in which the read enable (RE_N) signal is low. For example, when the read enable (RE_N) signal is changed from a high state to a low state, the external clock signal O_CLOCK may be activated to the high state at T1. At T1, the memory device 100 may perform an operation corresponding to first external ROM data ROM DATA1 stored in the external ROM data latch 941. In addition, when the read enable (RE_N) signal is changed from the high state to the low state, the external clock signal O_CLOCK may be activated to the high state at T2. At T2, the memory device 100 may perform an operation corresponding to second external ROM data ROM DATA2 stored in the external ROM data latch 941. In addition, when the read enable (RE_N) signal is changed from the high state to the low state, the external clock signal O_CLOCK may be activated to the high state at T3. At T3, the memory device 100 may perform an operation corresponding to third external ROM data ROM DATA3 stored in the external ROM data latch 941.

Moreover, although a case where the memory device 100 receives the external clock signal O_CLOCK in a state in which the read enable (RE_N) signal is low is illustrated in FIG. 12, the present disclosure is not limited thereto. In an embodiment, the memory device 100 may receive the external clock signal O_CLOCK in a state in which the read enable (RE_N) signal is high. When the read enable (RE_N) signal is changed from the low state to the high state, the external clock signal O_CLOCK may be activated to the high state.

Figure 13:
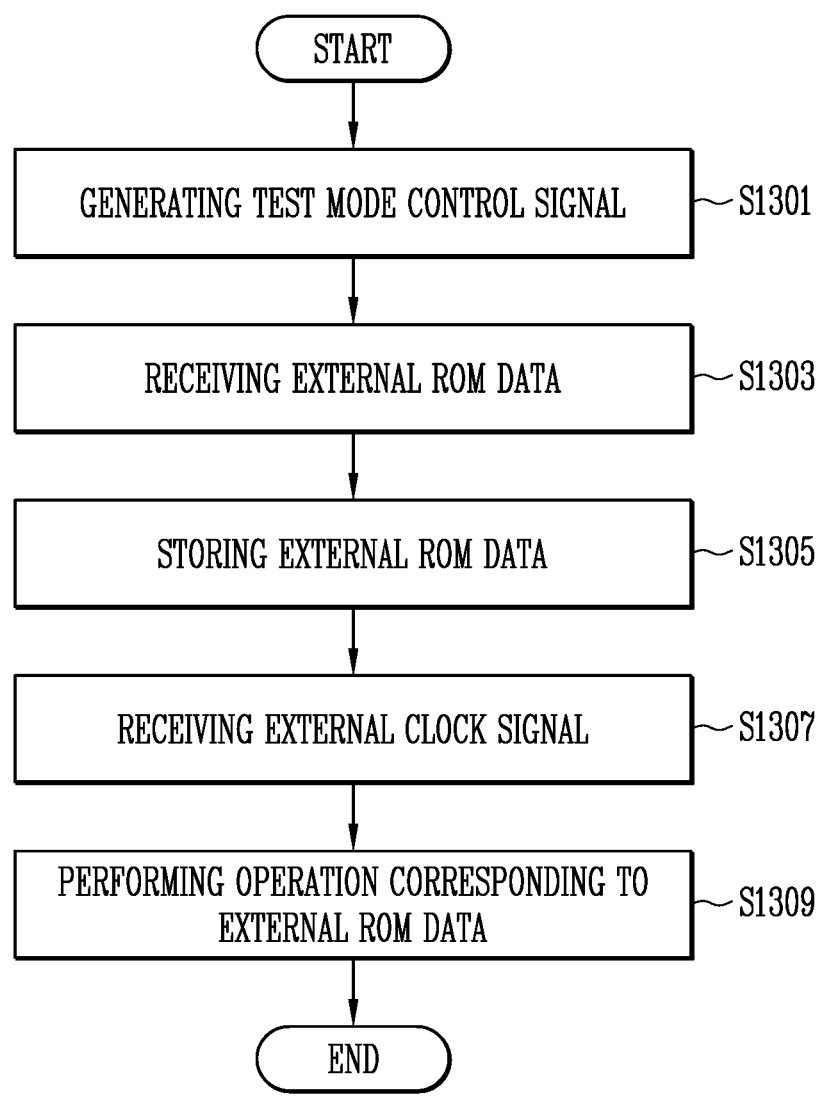
FIG. 13 is a flowchart illustrating an operating method of a memory device in accordance with an embodiment of the present disclosure.

FIG. 13 is a flowchart illustrating an operating method of a memory device in accordance with an embodiment of the present disclosure.

The operating method shown in FIG. 13 may be performed by, for example, the memory device 100 shown in FIG. 2 or FIG. 8.

Referring to FIG. 13, in operation S1301, the memory device 100 may generate a test mode control signal for activating a test mode of the memory device 100.

In operation S1303, the memory device 100 may receive external ROM data from the memory controller 200 through the first pad. For example, the memory device 100 may receive the external ROM data through the first pad in response to the test mode control signal.

In operation S1305, the memory device 100 may store the external ROM data.

In operation S1307, the memory device 100 may receive an external clock signal corresponding to the external ROM data from the memory controller 200 through the second pad. For example, the memory device 100 may receive the external clock signal through the second pad in response to the test mode control signal.

In operation S1309, the memory device 100 may perform an operation corresponding to the external ROM data, based on the external clock signal, in response to the test mode.

Figure 14:
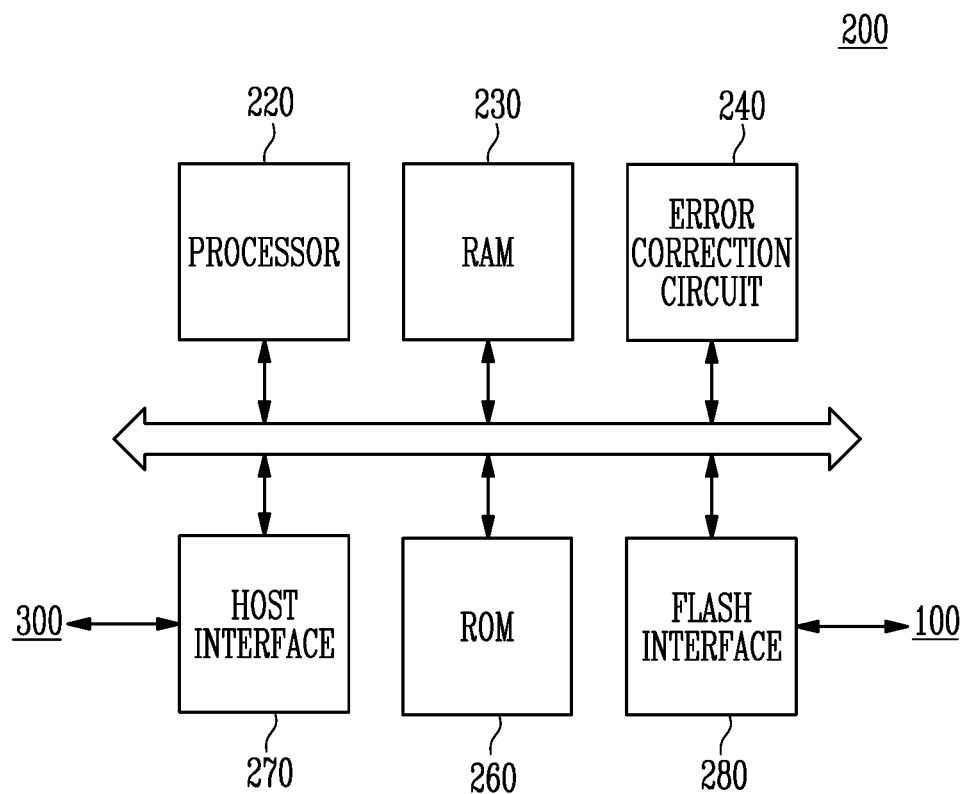
FIG. 14 is a diagram illustrating the memory controller shown in FIG. 1, in accordance with an embodiment of the present disclosure.

FIG. 14 is a diagram illustrating the memory controller shown in FIG. 1, in accordance with an embodiment of the present disclosure.

Referring to FIGS. 1 and 14, the memory controller 200 may include a processor 220, a RAM 230, an error correction circuit 240, ROM 250, a host interface 270, and a flash interface 280.

The processor 220 may control overall operations of the memory controller 200. The RAM 230 may be used as a buffer memory, a cache memory, a working memory, etc. of the memory controller 200.

The error correction circuit 240 may perform error correction. The error correction circuit 240 may perform error correction code (ECC) encoding on data to be written to the memory device through the flash interface 280. The ECC-encoded data may be transferred to the memory device through the flash interface 280. The error correction circuit 240 may perform ECC decoding on data received from the memory device through the flash interface 280. As an example, the error correction circuit 240 may be included as a component of the flash interface 280 in the flash interface 280.

The ROM 260 may store, in the form of firmware, various information for an operation of the memory controller 200. In an embodiment, the ROM 260 may represent a component different from the ROM 150 shown in FIG. 2 or FIG. 8.

The memory controller 200 may communicate with an external device (e.g., the host 300, an application processor, or the like) through the host interface 270.

The memory controller 200 may communicate with the memory device 100 through the flash interface 280. The memory controller 200 may transmit a command, an address, a control signal, and the like to the memory device 100 through the flash interface 280, and receive data DATA. As an example, the flash interface 280 may include a NAND interface.

Figure 15:
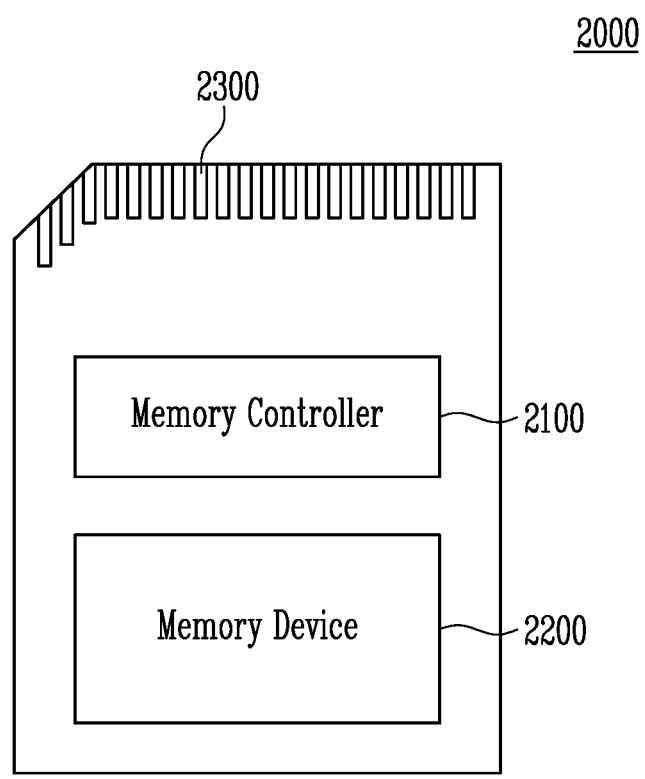
FIG. 15 is a block diagram illustrating a memory card system to which the storage device is applied in accordance with an embodiment of the present disclosure.

FIG. 15 is a block diagram illustrating a memory card system to which the storage device is applied in accordance with an embodiment of the present disclosure.

Referring to FIG. 15, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control read, write, erase, and background operations of the memory device 2200. The memory controller 2100 provides an interface between the memory device 2200 and a host Host. The memory controller 2100 drives firmware for controlling the memory device 2200. The memory controller 2100 may be implemented identically to the memory controller 200 described with reference to FIG. 1. The memory device 2200 may be implemented identically to the memory device 100 described with reference to FIG. 2.

As an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. As an example, the memory controller 2100 may communicate with the external device through at least one of various communication standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. As an example, the connector 2300 may be defined by at least one of the above-described various communication standards or interfaces.

As an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 16:
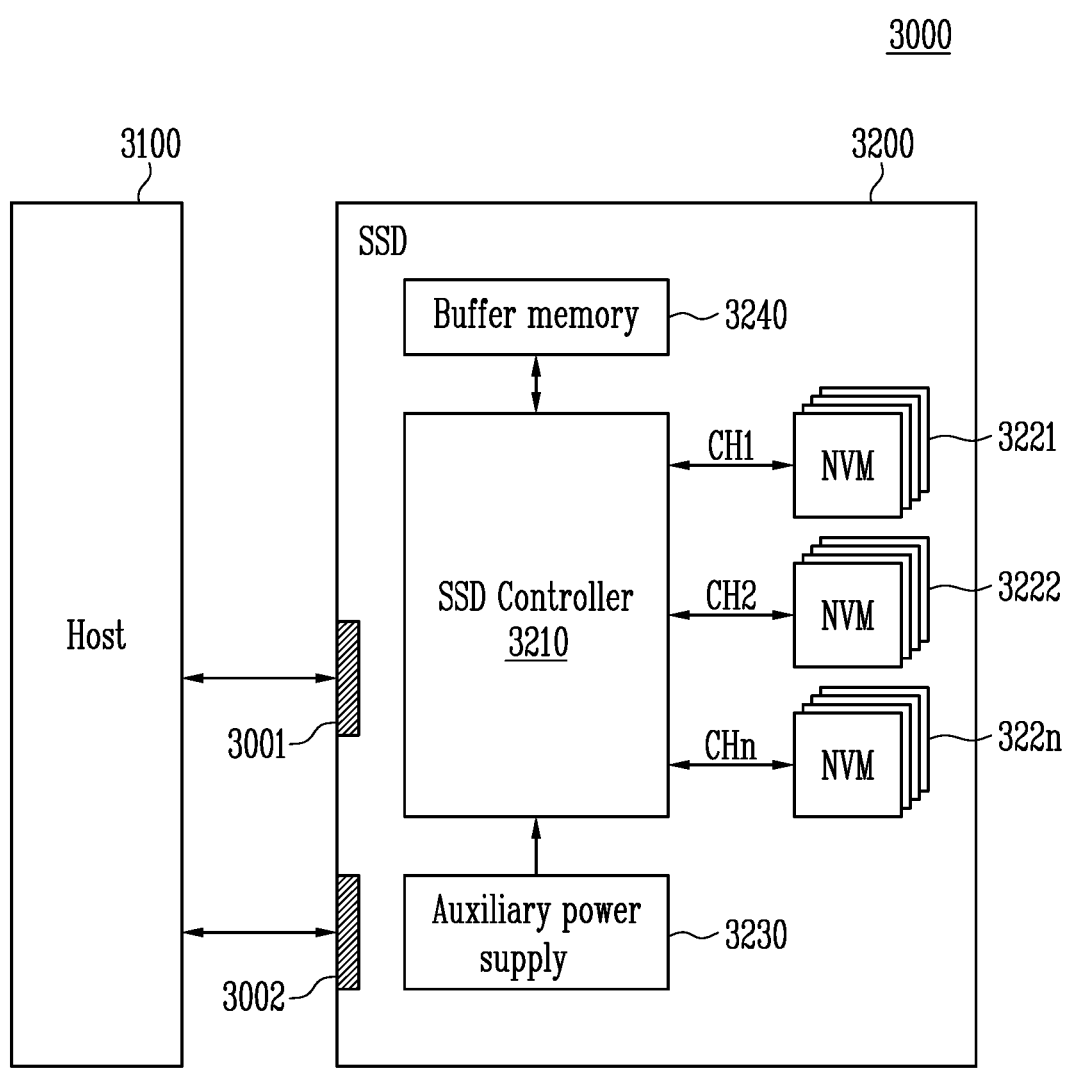
FIG. 16 is a block diagram illustrating a Solid State Drive (SSD) system to which the storage device is applied in accordance with an embodiment of the present disclosure.

FIG. 16 is a block diagram illustrating a Solid State Drive (SSD) system to which the storage device is applied in accordance with an embodiment of the present disclosure.

Referring to FIG. 16, the SSD system 3000 includes a host 3100 and an SSD 3200. The SSD 3200 exchanges a signal with the host 3100 through a signal connector 3001, and receives power through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal received from the host 3100. As an example, the signal may be a signal based on an interface between the host 3100 and the SSD 3200. For example, the signal may be a signal defined by at least one of communications standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power PWR input from the host 3100, and charge the power PWR. When the supply of power from the host 3100 is not smooth, the auxiliary power supply 3230 may provide power of the SSD 3200. As an example, the auxiliary power supply 3230 may be located in the SSD 3200, or be located at the outside of the SSD

3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 17:
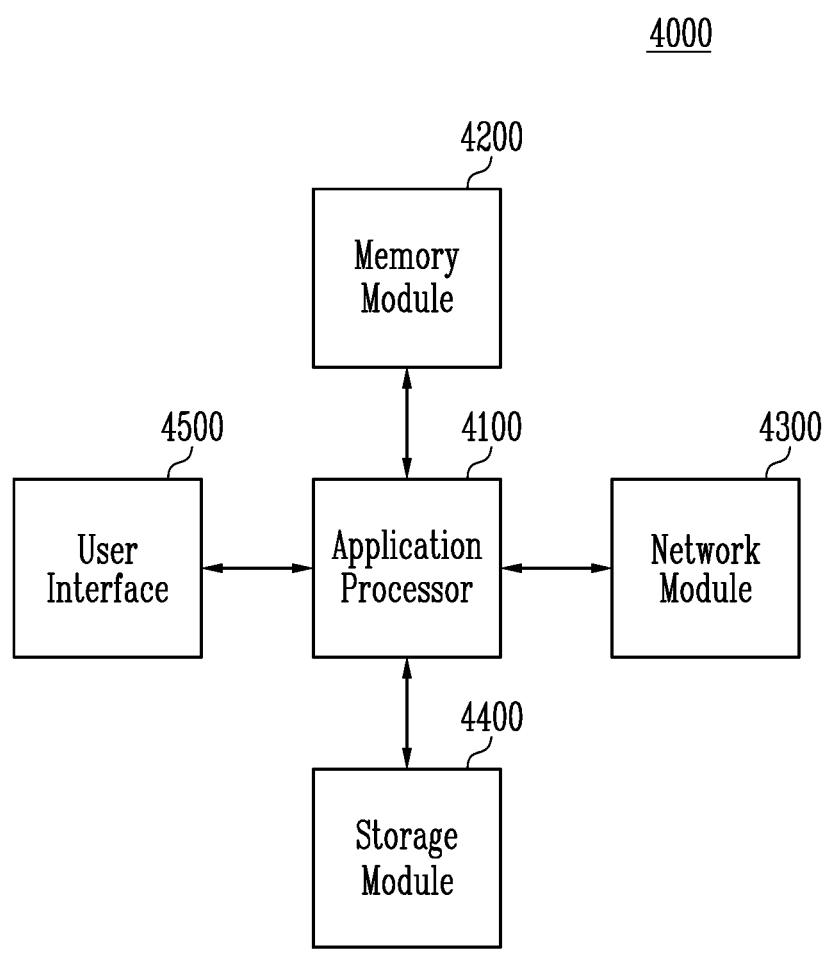
FIG. 17 is a block diagram illustrating a user system to which the storage device is applied in accordance with an embodiment of the present disclosure.

FIG. 17 is a block diagram illustrating a user system to which the storage device is applied in accordance with an embodiment of the present disclosure.

Referring to FIG. 17, the user system 4000 includes an application processor 4100, a memory module 4200, a network module 4300, a storage module 4400, and a user interface 4500.

The application processor 4100 may drive components included in the user system 4000, an operating system (OS), a user program, or the like. As an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRAM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. As an example, the application processor 4100 and the memory module 4200 may be provided as one semiconductor package by being packaged based on a Package on Package (PoP).

The network module 4300 may communicate with external devices. As an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. As an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. As an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. As an example, the storage module 4400 may be provided as a removable drive such as a memory card of the user system 4000 or an external drive.

As an example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. As an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a memory device capable of performing various memory tests without increasing a size of the memory device, and an operating method of the memory device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a first pad configured to receive external ROM data from a memory controller, the external ROM data received from outside of the memory device;
   a second pad configured to receive an external clock signal corresponding to the external ROM data from the memory controller, the external clock signal received from outside of the memory device; and
   a control logic connected to the first pad and the second pad and configured to perform an operation corresponding to the external ROM data and in synchronization with the external clock signal in a test mode.

2. The memory device of claim 1, wherein the control logic includes:
   a test mode controller configured to generate a test mode control signal for activating the test mode; and a micro controller configured to perform the operation corresponding to the external ROM data in response to the external clock signal.

3. The memory device of claim 2, wherein the control logic further includes a ROM data receiver configured to receive the external ROM data through the first pad in response to the test mode control signal.

4. The memory device of claim 3, wherein the micro controller includes an external ROM data latch configured to store the external ROM data.

5. The memory device of claim 2, wherein the control logic further includes a clock signal receiver configured to receive the external clock signal through the second pad in response to the test mode control signal.

6. The memory device of claim 1, wherein the first pad is an input/output pad which receives data input from the memory controller or outputs the data to the memory controller.

7. The memory device of claim 1, wherein the second pad is a read enable pad which receives a read enable signal from the memory controller.

8. A method for operating a memory device, the method comprising:
receiving external ROM data from a memory controller through a first pad, the external ROM data received from outside of the memory device;
receiving an external clock signal corresponding to the external ROM data from the memory controller through a second pad, the external clock signal received from outside of the memory device; and
performing an operation corresponding to the external ROM data, in synchronization with the external clock signal, in response to a test mode.

9. The method of claim 8, further comprising generating a test mode control signal for activating the test mode.

10. The method of claim 9, wherein, in the receiving of the external ROM data, the external ROM data is received in response to the test mode control signal.

11. The method of claim 10, further comprising storing the external ROM data.

12. The method of claim 9, wherein, in the receiving the external clock signal, the external clock signal is received in response to the test mode control signal.

13. The method of claim 8, wherein the first pad is an input/output pad which receives data input from the memory controller or outputs the data to the memory controller.

14. The method of claim 8, wherein the second pad is a read enable pad which receives a read enable signal from the memory controller.

15. A memory device comprising:
a ROM configured to store internal ROM data;
a clock signal generator configured to generate an internal clock signal corresponding to the internal ROM data;
a first pad configured to receive external ROM data from a memory controller;
a second pad configured to receive an external clock signal corresponding to the external ROM data from the memory controller; and
a control logic connected to the ROM, the clock signal generator, the first pad and the second pad and configured to perform one of an operation corresponding to the internal ROM data and an operation corresponding to the external ROM data according to an operation mode.

16. The memory device of claim 15, wherein the control logic includes:
a ROM data receiver configured to receive one of the internal ROM data and the external ROM data according to the operation mode;
a clock signal receiver configured to receive one of the internal clock signal and the external clock signal according to the operation mode; and
a micro controller configured to perform the operation corresponding to the internal ROM data in response to the internal clock signal or perform the operation corresponding to the external ROM data in response to the external clock signal, according to the operation mode.

17. The memory device of claim 16, wherein the control logic further includes a test mode controller configured to generate a test mode control signal for activating a test mode.

18. The memory device of claim 17,
wherein the ROM data receiver receives the external ROM data through the first pad in response to the test mode control signal, and
wherein the clock signal receiver receives the external clock signal through the second pad in response to the test mode control signal.

19. The memory device of claim 18, wherein the micro controller includes an external ROM data latch configured to store the external ROM data.

* * * * *